US012594581B2

(12) United States Patent
Osawa et al.

(10) Patent No.: US 12,594,581 B2
(45) Date of Patent: Apr. 7, 2026

(54) ELECTRONIC DEVICE

(71) Applicant: SEIKO EPSON CORPORATION, Tokyo (JP)

(72) Inventors: Eiji Osawa, Matsumoto (JP); Hikaru Iwai, Matsukawa (JP); Masahiro Komatsu, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 808 days.

(21) Appl. No.: 17/990,862

(22) Filed: Nov. 21, 2022

(65) Prior Publication Data

US 2023/0158547 A1 May 25, 2023

(30) Foreign Application Priority Data

Nov. 22, 2021 (JP) ................................. 2021-189196

(51) Int. Cl.
| *B06B 1/06* | (2006.01) |
| *H10N 30/06* | (2023.01) |
| *H10N 30/87* | (2023.01) |

(52) U.S. Cl.
CPC .......... *B06B 1/0629* (2013.01); *H10N 30/06* (2023.02); *H10N 30/875* (2023.02); *H10N 30/877* (2023.02)

(58) Field of Classification Search
CPC .... B06B 1/0629; B06B 1/0692; H10N 30/06; H10N 30/857; H10N 30/877; H10N 30/2047; G01H 11/08
See application file for complete search history.

(56) References Cited

U.S. PATENT DOCUMENTS

| 2010/0038778 A1* | 2/2010 | Lee ....................... H01L 23/481 257/E23.079 |
| 2021/0202823 A1 | 7/2021 | Osawa et al. |
| 2022/0148973 A1* | 5/2022 | Kudo ....................... H05K 1/11 |

FOREIGN PATENT DOCUMENTS

| JP | H06-338214 A | 12/1994 |
| JP | 2020-198359 A | 12/2020 |
| JP | 2021-106183 A | 7/2021 |

* cited by examiner

*Primary Examiner* — Emily P Pham
(74) *Attorney, Agent, or Firm* — Harness, Dickey & Pierce, P.L.C.

(57) ABSTRACT

An electronic device includes a first substrate including a first face on which a common terminal to be coupled to the element is disposed, and a second substrate which has a second face and a third face, and which is arranged so that the second face faces to the first face, wherein the second substrate has a first through hole at a position corresponding to the common terminal, the first through hole penetrating from the second face to the third face, a first through electrode electrically coupled to the common terminal is disposed in the first through hole, and a void is disposed in a part of the first through electrode.

7 Claims, 9 Drawing Sheets

*FIG. 5*

ELECTRONIC DEVICE

The present application is based on, and claims priority from JP Application Serial Number 2021-189196, filed Nov. 22, 2021, the disclosure of which is hereby incorporated by reference herein in its entirety.

BACKGROUND

1. Technical Field

The present disclosure relates to an electronic device.

2. Related Art

In the past, there has been known an electronic device having piezoelectric elements arranged in a matrix. For example, an electronic device provided with a sealing plate having an opening, a vibrating plate for closing the opening, and a piezoelectric element which is installed on the vibrating plate, and in which a piezoelectric body is sandwiched by an upper electrode and a lower electrode is disclosed in JP-A-2021-106183 (Document 1).

According to Document 1, the vibrating plate and the sealing plate are arranged to be opposed to each other. The sealing plate limits a range in which the vibrating plate vibrates. A frequency with which the vibrating plate vibrates is set by a size of the vibrating plate surrounded by the opening of the sealing plate. As a material of the sealing plate, there is used a material difficult to absorb the vibration of the vibrating plate.

The sealing plate is provided with a pair of through electrodes. The upper electrode and the lower electrode are electrically coupled to the through electrodes, respectively. The sealing plate is arranged so as to be opposed to a wiring board. The wiring board is provided with pads. The through electrodes protrude toward the wiring board. The pads and the through electrodes have electrical contact with each other, respectively. The upper electrode and the lower electrode are electrically coupled to the pads via the through electrodes, respectively.

The through electrodes are each formed of a resin adhesive including filler metal. When forming the through electrodes, the liquid resin adhesive including the filler metal is poured into through holes. The liquid resin adhesive is dried by heating, and is thus solidified. On this occasion, a solvent included in the liquid resin adhesive evaporates. In the process in which the resin adhesive is solidified, a volume of the resin adhesive decreases.

In the electronic device in Document 1, there is a possibility that the through holes of the sealing plate contract to generate a crack in the vibrating plate when the through electrodes contract in a manufacturing process of the through electrodes.

SUMMARY

An electronic device includes a first substrate provided with an element, and including a first face on which a first electrode to be coupled to the element is disposed, and a second substrate which has a second face and a third face, and which is disposed so that the second face is opposed to the first face, wherein the second substrate has a through hole at a position corresponding to the first electrode, the through hole penetrating from the second face to the third face, the through hole is provided with a through electrode electrically coupled to the first electrode, and a void is disposed in a part of the through electrode.

BRIEF DESCRIPTION OF THE DRAWINGS

FIG. 5 is a schematic sectional side view showing a configuration of a through electrode.

DESCRIPTION OF EXEMPLARY EMBODIMENTS

First Embodiment

In the present embodiment, characteristic examples of an electronic device and an electronic device manufacturing method of manufacturing the electronic device will be described.

Figure 1:
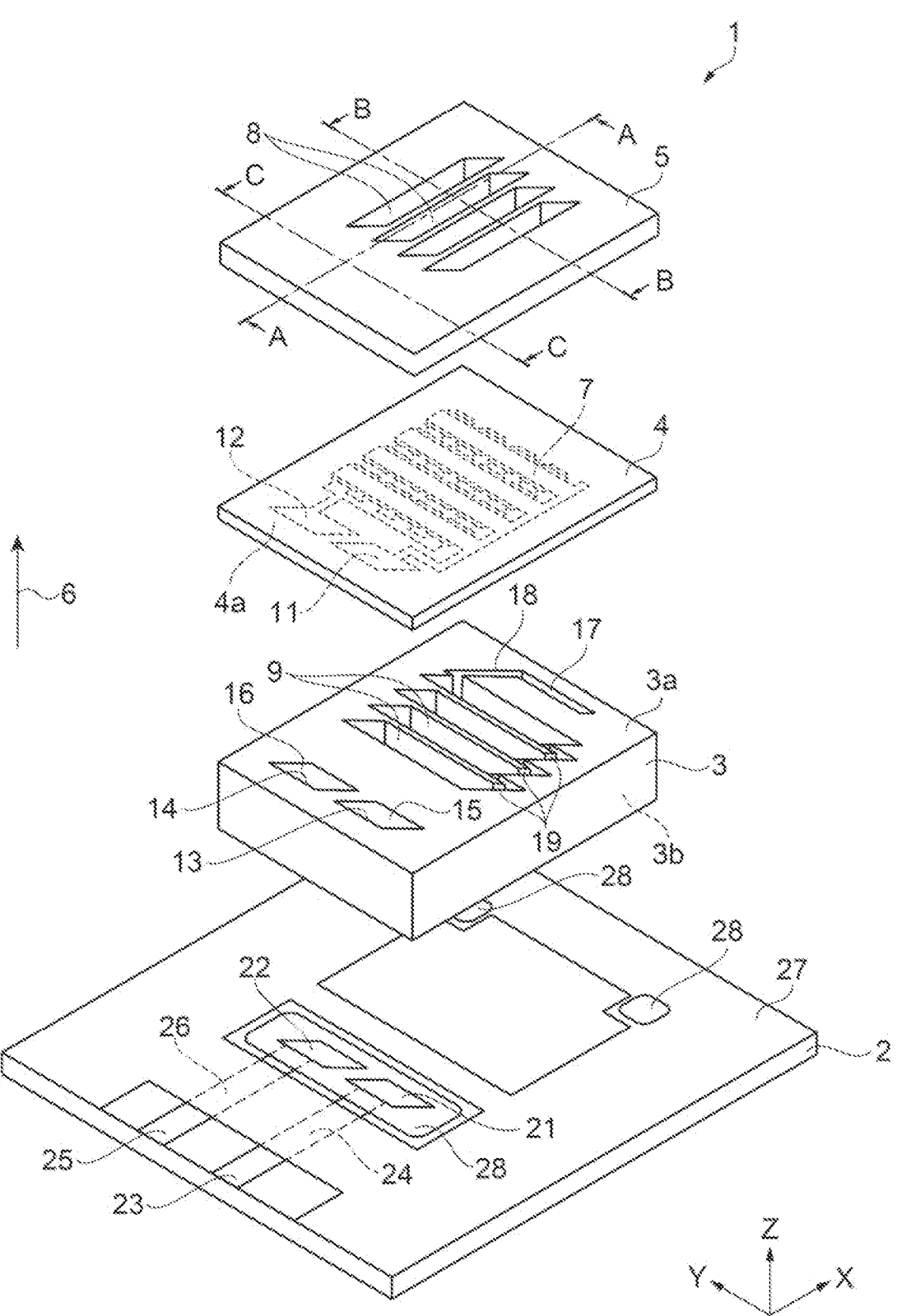
FIG. 1 is a schematic exploded perspective view showing a configuration of an electronic device according to a first embodiment.

As shown in FIG. 1, in an electronic device 1, a third substrate 2, a second substrate 3, a first substrate 4, and a fourth substrate 5 are stacked in a Z direction in this order. In the Z direction, the fourth substrate 5 side is defined as a positive Z direction, and the third substrate 2 side is defined as a negative Z direction. A direction along the positive Z direction is defined as a first direction 6. The first direction 6 is a stacking direction of the first substrate 4 and the second substrate 3.

When viewed from the first direction 6, the third substrate 2, the second substrate 3, the first substrate 4, and the fourth substrate 5 each have a rectangular shape. The third substrate 2, the second substrate 3, the first substrate 4, and the fourth substrate 5 are the same in longitudinal direction. The second substrate 3, the first substrate 4, and the fourth substrate 5 are the same in shape. The third substrate 2 is larger than the second substrate 3, the first substrate 4, and the fourth substrate 5.

A longitudinal direction of the third substrate 2 is defined as an X direction. A short-side direction of the third substrate 2 is defined as a Y direction. The X direction, the Y direction, and the Z direction are perpendicular to each other.

The first substrate 4 includes a first face 4a facing to the second substrate 3. On the first face 4a, there are arranged elements 7 in a matrix. The elements 7 are each a piezo-electric element. According to this configuration, the elements 7 are the piezoelectric elements. By applying an AC voltage to the elements 7, it is possible for the electronic device 1 to vibrate the first substrate 4 to emit an ultrasonic wave. The first substrate 4 is also referred to as a vibrating plate.

The number of the elements 7 is not particularly limited. In the present embodiment, for example, the elements 7 constitute a 4×4 matrix, and therefore, the number of the elements 7 is sixteen.

The fourth substrate 5 is provided with four fourth holes 8 elongated in the X direction. When viewed from the first direction 6, the shape of the fourth hole 8 is a parallelogram. The fourth substrate 5 is formed of a silicon single-crystal substrate. The fourth holes 8 are formed using a wet-etching process. A side surface of the fourth hole 8 is a crystal face low in etching rate. Since in the silicon single-crystal substrate, the crystal face low in etching rate has a paral-lelogram shape, the shape of each of the fourth holes 8 is a parallelogram. The fourth holes 8 penetrate the fourth sub-strate 5. The fourth holes 8 are arranged at places opposed to the arrangement of the elements 7. It should be noted that the number of the fourth holes 8 is not limited to four.

The second substrate 3 has a second face 3*a* and a third face 3*b*. The second face 3*a* is arranged so as to be opposed to the first face 4*a* of the first substrate 4. The second substrate 3 is provided with four second grooves 9 elongated in the Y direction on the second face 3*a*. When viewed from the first direction 6, the shape of the second groove 9 is a parallelogram. The second substrate 3 is formed of a silicon single-crystal substrate. The second grooves 9 are formed using a wet-etching process. Therefore, the shape of the second groove 9 is a parallelogram. The second grooves 9 are arranged at places opposed to the arrangement of the elements 7.

When viewed from the first direction 6, the elements 7 are arranged at places where the fourth holes 8 and the second grooves 9 cross each other. Therefore, at the place where the element 7 is arranged, the first substrate 4 can vibrate in the positive Z direction and the negative Z direction.

The first substrate 4 and the fourth substrate 5 are inte-grated with each other. The material of the first substrate 4 is silicon oxide, and the first substrate 4 is formed by oxidizing the fourth substrate 5.

The first substrate 4 is provided with a common terminal 11 as a first electrode and a drive terminal 12 as the first electrode on the first face 4*a*. The common terminal 11 and the drive terminal 12 are electrically coupled to the elements 7.

The second substrate 3 has a first through hole 13 as a through hole penetrating from the second face 3*a* to the third face 3*b* at a position corresponding to the common terminal 11. The second substrate 3 has a second through hole 14 as a through hole penetrating from the second face 3*a* to the third face 3*b* at a position corresponding to the drive terminal 12.

A size of the first through hole 13 is not particularly limited. In the present embodiment, for example, a length of a long side of the first through hole 13 is about 1 mm. A width in the X direction of the first through hole 13 is about 350 μm. A thickness of the second substrate 3 is about 400 μm. The second through hole 14 is the same in size as the first through hole 13.

In the first through hole 13 of the second substrate 3, there is disposed a first through electrode 15 as a through electrode at the negative Z direction side of the common terminal 11.

The first through electrode 15 is electrically coupled to the common terminal 11. In the second through hole 14 of the second substrate 3, there is disposed a second through electrode 16 as a through electrode at the negative Z direction side of the drive terminal 12. The second through electrode 16 is electrically coupled to the drive terminal 12.

The second substrate 3 is provided with an opening hole 17 at the positive X direction side of the second grooves 9. The opening hole 17 penetrates from the second face 3*a* to the third face 3*b*. The opening hole 17 and the second groove 9 are connected with a first communication groove 18. The four second grooves 9 are connected to each other with second communication grooves 19.

The second substrate 3 and the first substrate 4 are fixed with an adhesive. The second grooves 9 are connected to the opening hole 17, the first communication groove 18 and the second communication grooves 19, and are therefore not sealed. When the first substrate 4 vibrates, the air in the second grooves 9 is connected to the outside air, and therefore, inside pressure of the second grooves 9 is difficult to fluctuate. Therefore, the first substrate 4 is made easy to vibrate.

The third substrate 2 is arranged so as to be opposed to the third face 3*b* of the second substrate 3. The third substrate 2 is provided with a common coupling terminal 21 as a second electrode at a place corresponding to the first through electrode 15. The common coupling terminal 21 is electri-cally coupled to the first through electrode 15. The third substrate 2 is provided with a drive coupling terminal 22 as the second electrode at a place corresponding to the second through electrode 16. The drive coupling terminal 22 is electrically coupled to the second through electrode 16.

According to this configuration, the common coupling terminal 21 is electrically coupled to the first through electrode 15. The drive coupling terminal 22 is electrically coupled to the second through electrode 16. Therefore, by supplying the common coupling terminal 21 and the drive coupling terminal 22 with electrical power, it is possible to supply the electrical power to the elements 7.

The third substrate 2 is provided with an external common terminal 23 at the negative X direction side of the common coupling terminal 21. The external common terminal 23 and the common coupling terminal 21 are electrically coupled to each other with an interconnection 24. The third substrate 2 is provided with an external drive terminal 25 at the negative X direction side of the drive coupling terminal 22. The external drive terminal 25 and the drive coupling terminal 22 are electrically coupled to each other with an interconnec-tion 26.

The interconnection 24 and the interconnection 26 are covered with a resist 27. The common coupling terminal 21, the drive coupling terminal 22, the external common termi-nal 23, and the external drive terminal 25 are not covered with the resist 27 but are exposed. The common coupling terminal 21 is electrically coupled to the first through electrode 15. The drive coupling terminal 22 is electrically coupled to the second through electrode 16.

On an end at the positive X direction side of the second substrate 3, a corner at the positive Y direction side and a corner at the negative Y direction side are fixed by bonding to the third substrate 2 with fixing adhesives 28. On an end at the negative X direction side of the second substrate 3, the periphery of the first through electrode 15 and the second through electrode 16 is fixed by bonding to the third sub-strate 2 with the fixing adhesive 28.

Figure 2:
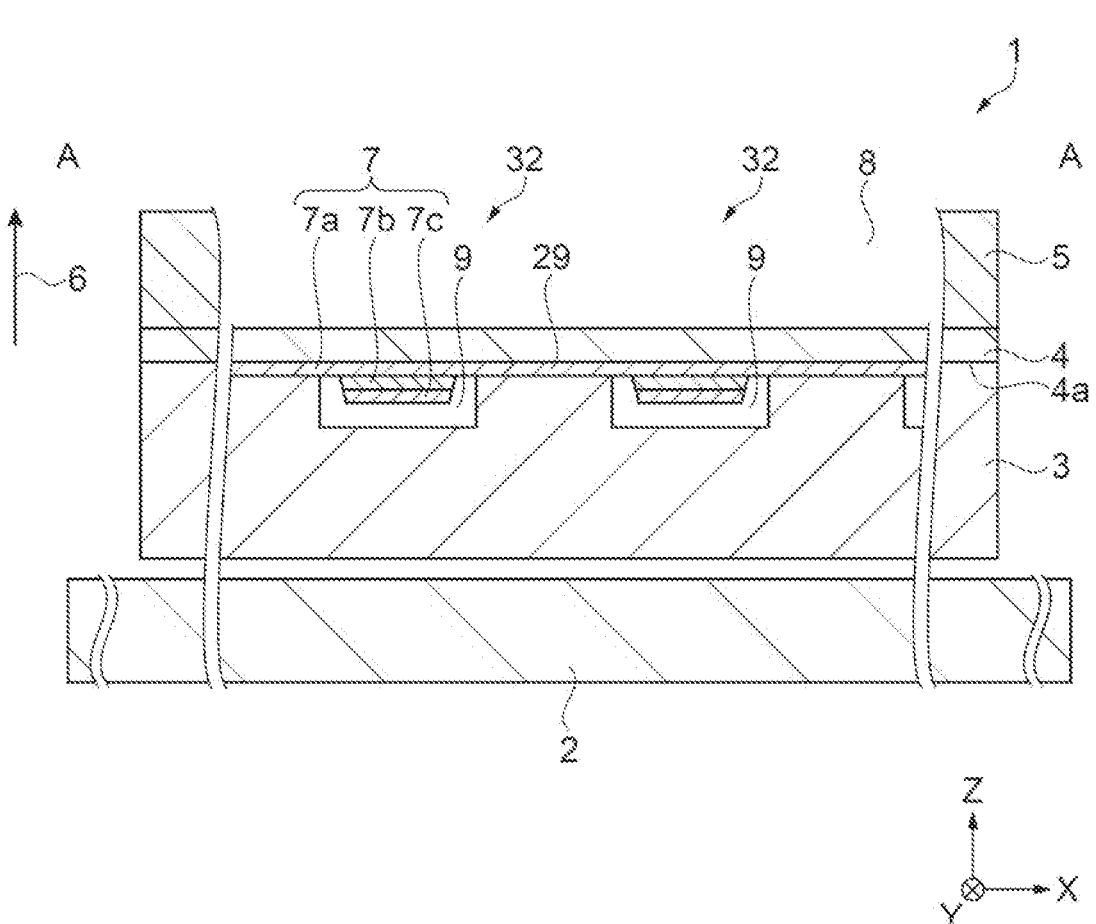
FIG. 2 is a schematic sectional side view showing a configuration of the electronic device.
Figure 3:
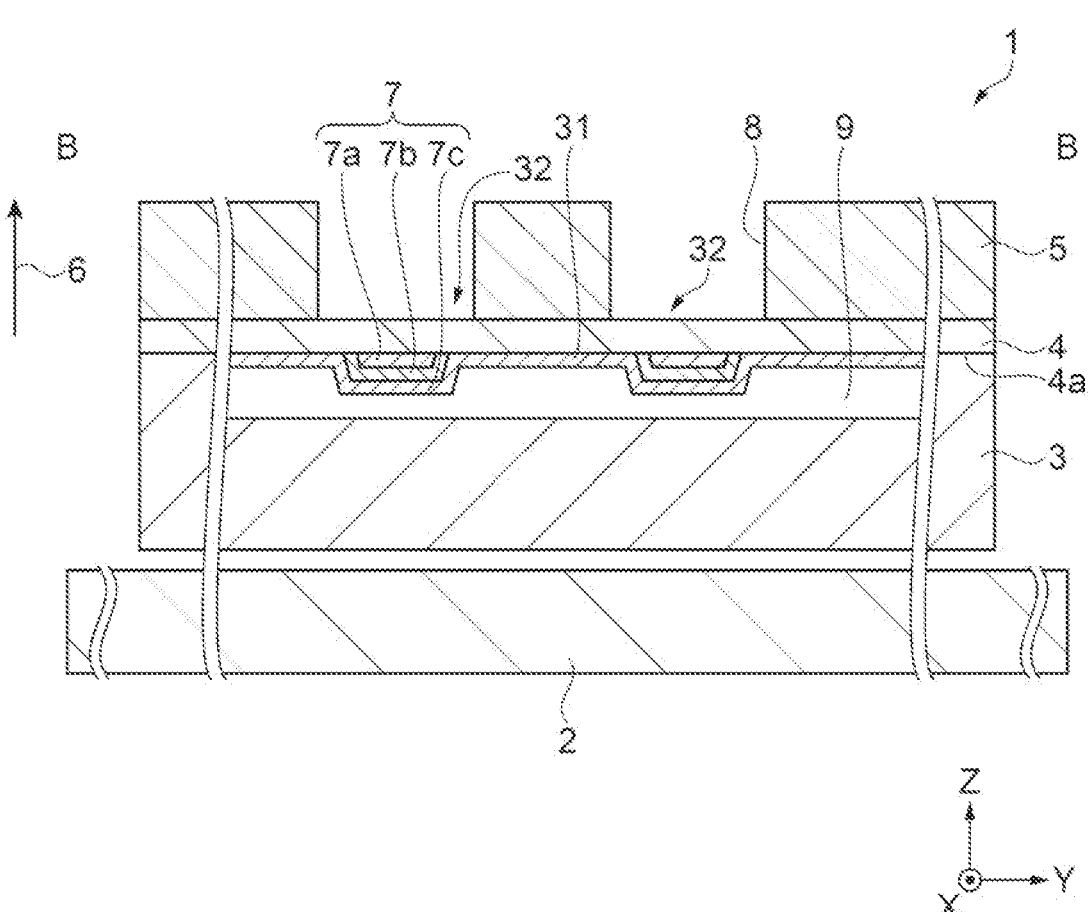
FIG. 3 is a schematic sectional side view showing the configuration of the electronic device.

FIG. 2 is a cross-sectional view along a line A-A in FIG. 1. FIG. 3 is a cross-sectional view along a line B-B in FIG.

1. As shown in FIG. 2 and FIG. 3, when viewed from the first direction 6, the elements 7 are arranged at the places where the fourth holes 8 and the second grooves 9 cross each other. The elements 7 are arranged on the first face 4a of the first substrate 4. The element 7 is constituted by a drive electrode 7a, a piezoelectric film 7b, and a common electrode 7c arranged in the negative Z direction from the first face 4a.

The piezoelectric film 7b is formed using, for example, transition metal oxide having a perovskite structure. Specifically, the piezoelectric film 7b is formed using lead zirconate titanate including Pb, Ti, and Zr.

The plurality of drive electrodes 7a is electrically coupled to a drive interconnection 29 extending in the X direction. The drive electrodes 7a and the drive interconnection 29 are the same in material as each other. The plurality of common electrodes 7c is electrically coupled to a common interconnection 31 extending in the Y direction. The common electrodes 7c and the common interconnection 31 are the same in material as each other.

The first substrate 4 and the element 7 constitute an ultrasonic transducer 32. The common electrode 7c is kept at a predetermined reference potential. Further, by inputting a drive pulse signal into the drive electrode 7a, the element 7 deforms, and thus, the first substrate 4 vibrates. Thus, the ultrasonic transducer 32 transmits an ultrasonic wave toward the positive Z direction. When an object exists at the positive Z direction side of the electronic device 1, the ultrasonic wave is reflected by the object. When the reflected ultrasonic wave passes through the fourth hole 8 of the fourth substrate 5 to reach the ultrasonic transducer 32, the first substrate 4 vibrates in accordance with sound pressure of the ultrasonic wave. The piezoelectric film 7b deforms due to the vibration of the first substrate 4, and thus, a potential difference occurs between the drive electrode 7a and the common electrode 7c. Thus, a reception signal corresponding to the sound pressure of the ultrasonic wave received is output from the drive electrode 7a of the ultrasonic transducer 32. In other words, the ultrasonic wave is detected.

By measuring the time from when the electronic device 1 transmits the ultrasonic wave to when the electronic device 1 receives the ultrasonic wave, it is possible to measure a distance between the electronic device 1 and the object.

Figure 4:
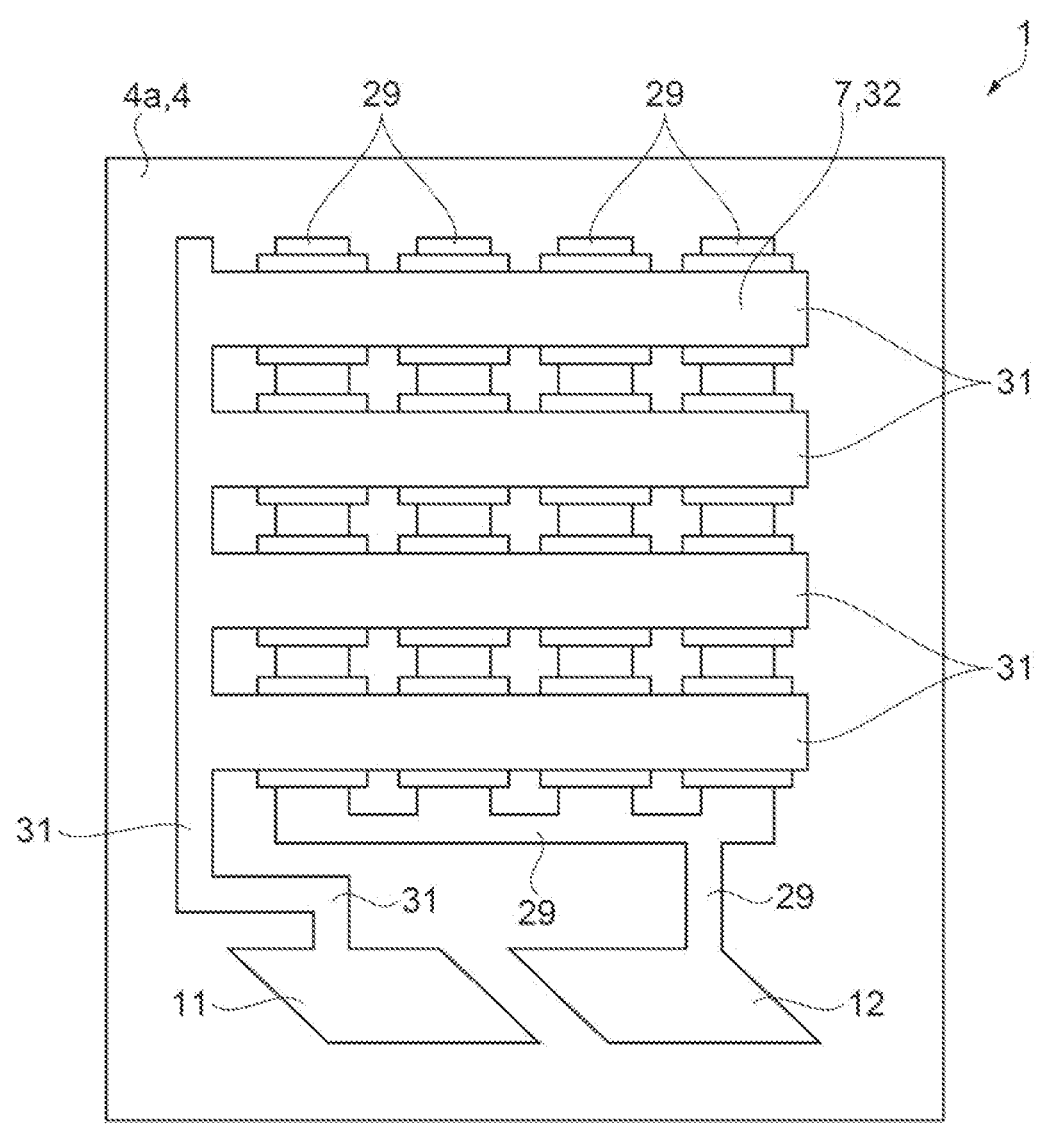
FIG. 4 is a schematic plan view showing a configuration of a first substrate.
Figure 4:
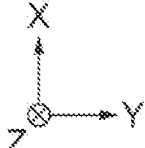

FIG. 4 is a diagram of the first substrate 4 viewed from the second substrate 3 side. As shown in FIG. 4, on the first face 4a, there are arranged the four drive interconnections 29 extending in the X direction. The drive interconnections 29 are integrated with each other at the negative X direction side, and are electrically coupled to the drive terminal 12. On the first face 4a, there are arranged the four common interconnections 31 extending in the Y direction. The common interconnections 31 are integrated with each other at the negative Y direction side, and are electrically coupled to the common terminal 11.

Figure 5:
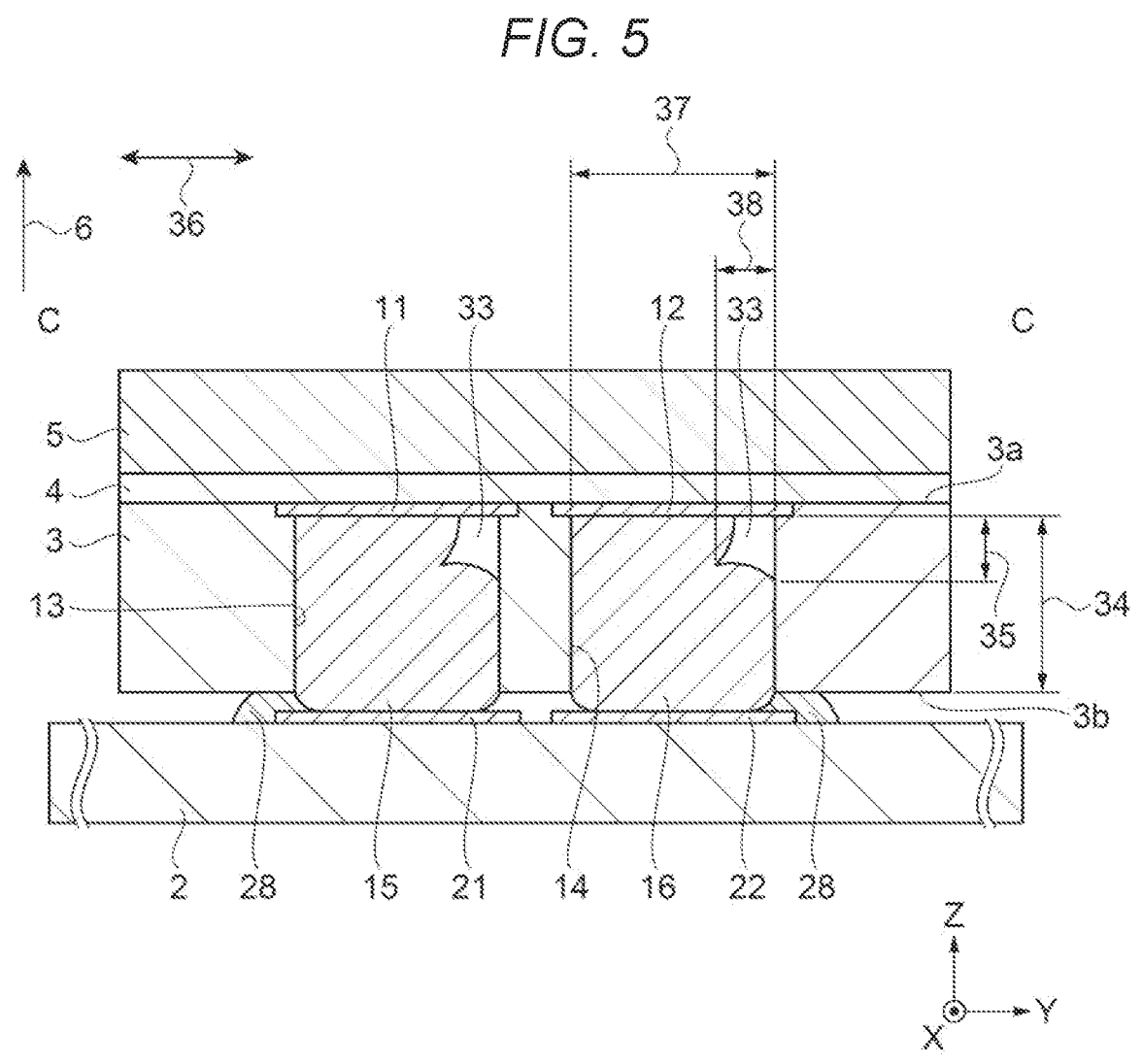

FIG. 5 is a cross-sectional view along a line C-C in FIG. 1. As shown in FIG. 5, the first through electrode 15 electrically couples the common terminal 11 and the common coupling terminal 21 to each other. The second through electrode 16 electrically couples the drive terminal 12 and the drive coupling terminal 22 to each other.

The third substrate 2 is arranged so as to be opposed to the third face 3b of the second substrate 3. The third substrate 2 has the common coupling terminal 21 which is electrically coupled to the first through electrode 15. The third substrate 2 has the drive coupling terminal 22 which is electrically coupled to the second through electrode 16.

According to this configuration, the common coupling terminal 21 is electrically coupled to the first through electrode 15. The drive coupling terminal 22 is electrically coupled to the second through electrode 16. Therefore, by supplying the common coupling terminal 21 and the drive coupling terminal 22 with electrical power, it is possible to supply the electrical power to the elements 7.

The first through electrode 15 and the second through electrode 16 are each formed of an electrically-conductive adhesive. Specifically, the first through electrode 15 and the second through electrode 16 are resin including silver filler. The resin is obtained by heating the resin adhesive to thereby solidify the resin adhesive. As the resin adhesive, there can be used, for example, an epoxy resin adhesive, an urethane resin adhesive, or a silicone resin adhesive.

In a formation process of the first through electrode 15, the adhesive poured into the first through hole 13 is dried by heating. In a formation process of the second through electrode 16, the adhesive poured into the second through hole 14 is dried by heating. The adhesives are solidified with contraction.

A void 33 is provided to a part of each of the first through electrode 15 and the second through electrode 16. According to this configuration, even when the material of the first through electrode 15 and the second through electrode 16 contracts when forming the first through electrode 15 and the second through electrode 16, the voids 33 expand. Therefore, since the stress of contracting the first through hole 13 and the second through hole 14 is reduced, the contraction of the first through hole 13 and the second through hole 14 is reduced. As a result, it is possible to reduce an occurrence of a crack in the first substrate 4.

A proportion of a volume of the void 33 to a volume of the first through hole 13 is no lower than 1% and no higher than 50%. According to this configuration, since the proportion of the volume of the void 33 to the volume of the first through hole 13 is no lower than 1%, even when the material of the first through electrode 15 contracts when forming the first through electrode 15, the contraction of the first through hole 13 is reduced. Since the proportion of the volume of the void 33 to the volume of the first through hole 13 is no higher than 50%, it is possible to make the electrical resistance of the first through electrode 15 low. Further, it is possible to prevent a conduction failure due to a broken line of the first through electrode 15.

Similarly, a proportion of a volume of the void 33 to a volume of the second through hole 14 is no lower than 1% and no higher than 50%. Therefore, even when the material of the second through electrode 16 contracts, the contraction of the second through hole 14 is reduced. It is possible to make the electrical resistance of the second through electrode 16 low. Further, it is possible to prevent a conduction failure due to a broken line of the second through electrode 16.

A length in the first direction 6 of the second through hole 14 is defined as a first through hole length 34. A length in the first direction 6 of the void 33 in the second through hole 14 is defined as a first void length 35. A ratio of the first void length 35 to the first through hole length 34 is no lower than 25% and no higher than 95%.

According to this configuration, since the ratio of the length in the first direction 6 of the void 33 to the length in the first direction 6 of the second through hole 14 is no lower than 25%, even when the material of the second through electrode 16 contracts when forming the second through electrode 16, the contraction of the second through hole 14 is reduced. Since the ratio of the length in the first direction 6 of the void 33 to the length in the first direction 6 of the second through hole 14 is no higher than 95%, it is possible to make the electrical resistance of the second through electrode 16 low. Further, it is possible to prevent the conduction failure due to the broken line of the second through electrode 16.

Similarly, a ratio of the length in the first direction 6 of the void 33 to the length in the first direction 6 of the first through hole 13 is no lower than 25% and no higher than 95%. Therefore, even when the material of the first through electrode 15 contracts, the contraction of the first through hole 13 is reduced. It is possible to make the electrical resistance of the first through electrode 15 low. Further, it is possible to prevent the conduction failure due to the broken line of the first through electrode 15.

Out of directions perpendicular to the first direction 6, a longitudinal direction of the first through hole 13 and the second through hole 14 is defined as a second direction 36. The second direction 36 corresponds to the Y direction. A length in the second direction 36 of the second through hole 14 is defined as a second through hole length 37. A length in the second direction 36 of the void 33 in the second through hole 14 is defined as a second void length 38. A ratio of the second void length 38 to the second through hole length 37 is no lower than 10% and no higher than 60%.

According to this configuration, since the ratio of the length in the second direction 36 of the void 33 to the length in the second direction 36 of the second through hole 14 is no lower than 10%, even when the material of the second through electrode 16 contracts when forming the second through electrode 16, the contraction of the second through hole 14 is reduced. Since the ratio of the length in the second direction 36 of the void 33 to the length in the second direction 36 of the second through hole 14 is no higher than 60%, it is possible to make the electrical resistance of the second through electrode 16 low. Further, it is possible to prevent the conduction failure due to the broken line of the second through electrode 16.

Similarly, a ratio of the length in the second direction 36 of the void 33 to the length in the second direction 36 of the first through hole 13 is no lower than 10% and no higher than 60%. Therefore, even when the material of the first through electrode 15 contracts, the contraction of the first through hole 13 is reduced. It is possible to make the electrical resistance of the first through electrode 15 low. Further, it is possible to prevent the conduction failure due to the broken line of the first through electrode 15.

Figure 6:
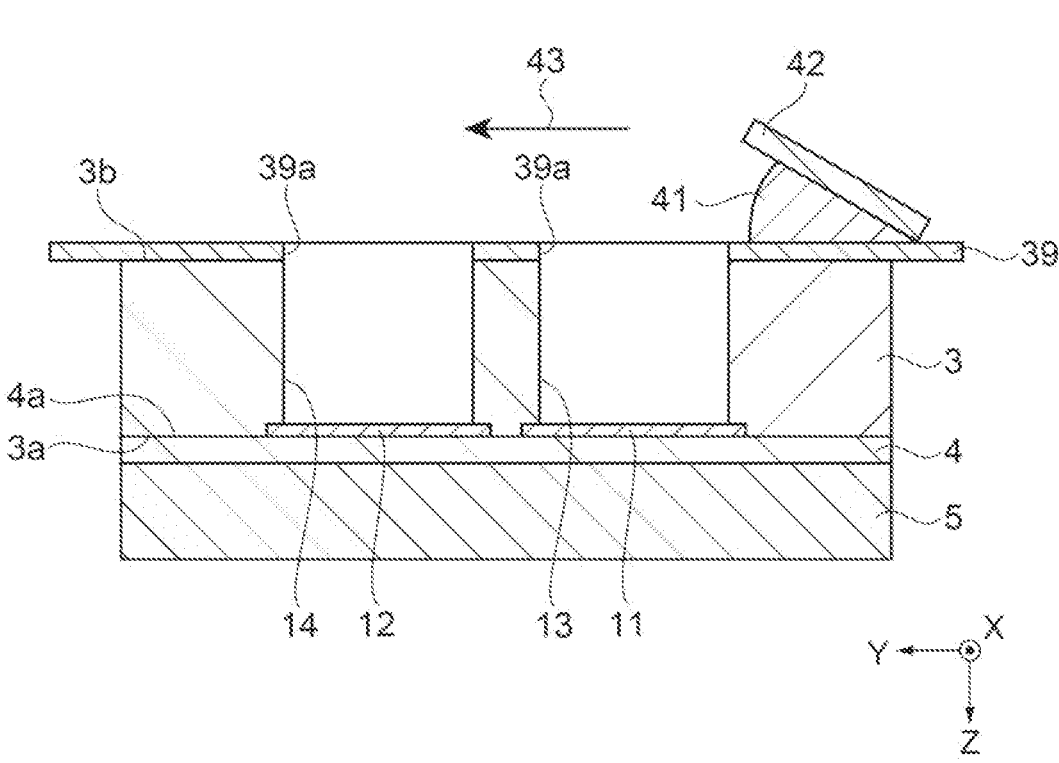
FIG. 6 is a schematic sectional side view for explaining a method of manufacturing the through electrode.

Then, a method of manufacturing the first through electrode 15 and the second through electrode 16 will be described. As shown in FIG. 6, the second substrate 3, the first substrate 4, and the fourth substrate 5 are prepared. The first substrate 4 is formed by oxidizing one surface of the fourth substrate 5.

The first substrate 4 is provided with the drive electrodes 7a, the drive interconnections 29, the piezoelectric films 7b, the common electrodes 7c, the common interconnections 31, the common terminal 11, and the drive terminal 12. For the formation of these elements, there are used a deposition method such as a sputtering method, a photolithography method, a dry-etching process, and so on. For the formation of the fourth holes 8 of the fourth substrate 5, there are used a photolithography method, a wet-etching process, and so on. For the formation of the second grooves 9, the first through hole 13, the second through hole 14, the opening hole 17, the first communication groove 18, and the second communication groove 19 of the second substrate 3, there are used a photolithography method, a wet-etching process, and so on. Then, the second substrate 3 is fixed to the first substrate 4 with an adhesive.

For the formation of the first through electrode 15 and the second through electrode 16, there is used a stencil printing method. The stencil printing method is in the same category of a leakage printing method as a silk-screen method. A stencil 39 is arranged on the third face 3b of the second substrate 3 in an overlapping manner. The stencil 39 is provided with holes 39a the same in shape as the first through hole 13 and the second through hole 14. It should be noted that the formation of the first through electrode 15 and the second through electrode 16 is not particularly limited. For example, it is possible to form the first through electrode 15 and the second through electrode 16 using a dispenser. On this occasion, it is possible to form the voids 33.

A paste 41 is mounted on the stencil 39 at the negative Y direction side. The paste 41 is a paste-like resin adhesive including the silver filler. The paste 41 includes a solvent and has fluidity. The paste 41 is sandwiched by a squeegee 42 and the stencil 39. The squeegee 42 is a plate long in the positive X direction. The positive Y direction is defined as a first sliding direction 43. The squeegee 42 is slid in the first sliding direction 43 in the state in which the squeegee 42 at the negative Y direction side has contact with the stencil 39. The paste 41 is pushed by the squeegee 42 to move in the first sliding direction 43.

Figure 7:
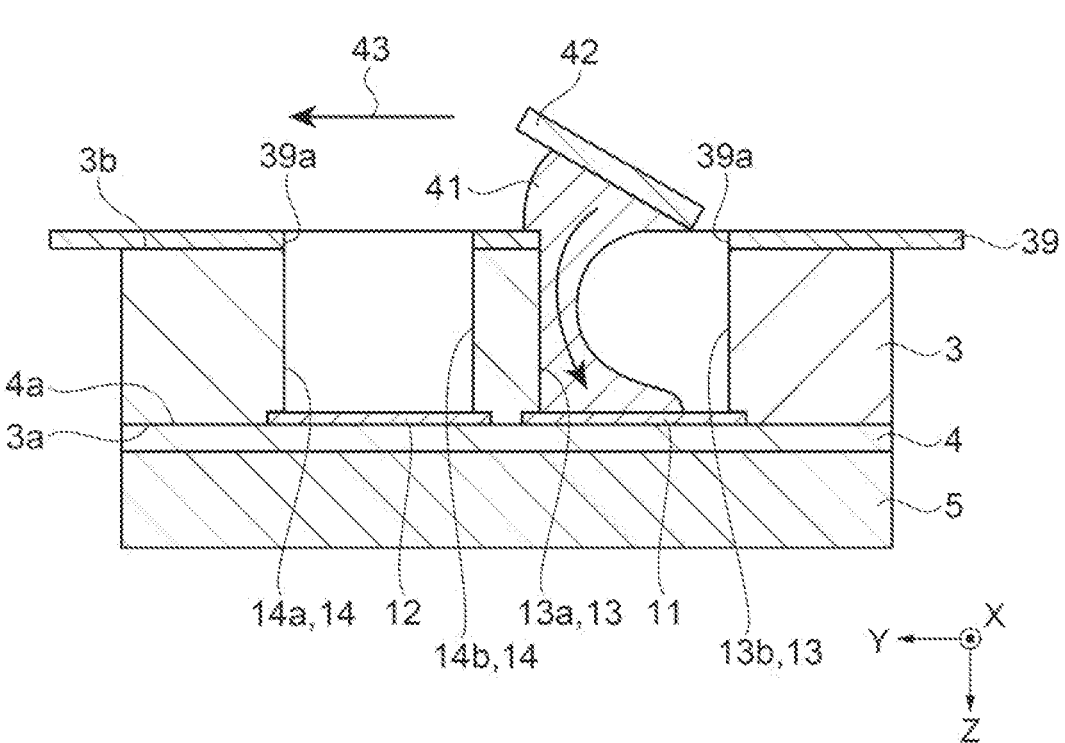
FIG. 7 is a schematic sectional side view for explaining the method of manufacturing the through electrode.

As shown in FIG. 7, when the squeegee 42 passes through the first through hole 13, a part of the paste 41 passes through the hole 39a to enter the first through hole 13. The part of the paste 41 moves to the common terminal 11 along a first wall 13a as a wall of the first through hole 13 at the positive Y direction side. The part of the paste 41 having reached the common terminal 11 moves in the negative Y direction along the common terminal 11. The paste 41 moving in the negative Y direction along the common terminal 11 does not reach a second wall 13b as a wall of the first through hole 13 at the negative Y direction side. By adjusting the viscosity of the paste 41, it is possible to prevent the paste 41 from reaching the second wall 13b.

A wall at the positive Y direction side in the second through hole 14 is defined as a third wall 14a. A wall at the negative Y direction side in the second through hole 14 is defined as a fourth wall 14b. In the second through hole 14, a part of the past 41 moves to the drive terminal 12 along the third wall 14a. The part of the paste 41 having reached the drive terminal 12 moves in the negative Y direction along the drive terminal 12. The paste 41 moving in the negative Y direction along the drive terminal 12 does not reach the fourth wall 14b.

Figure 8:
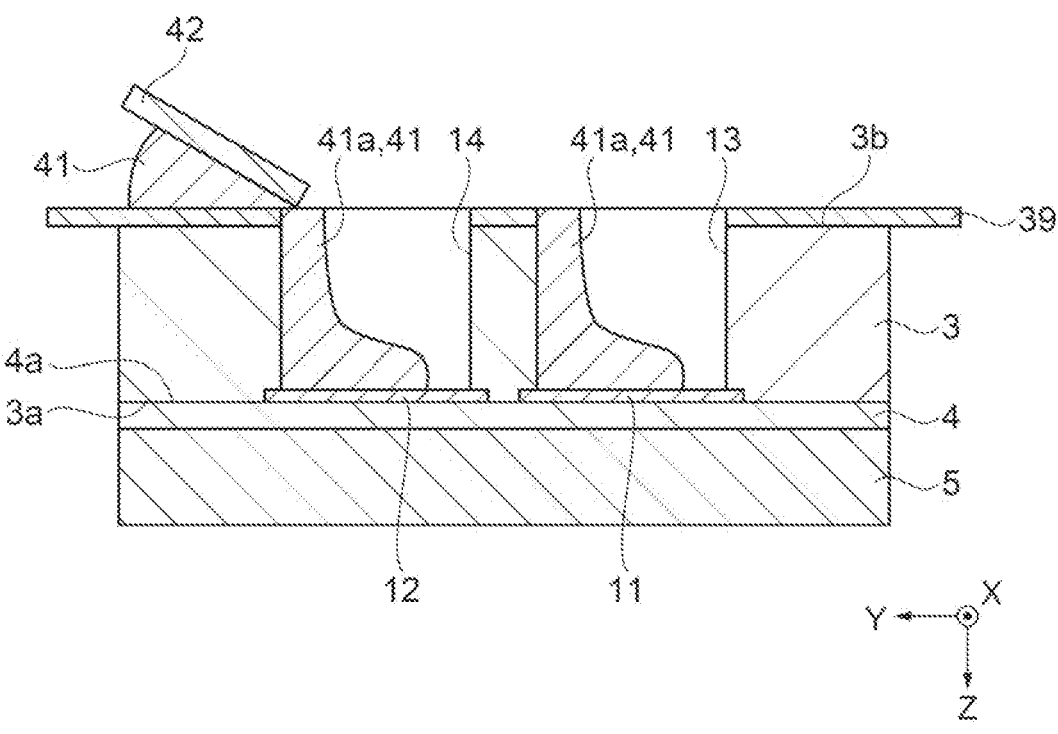
FIG. 8 is a schematic sectional side view for explaining the method of manufacturing the through electrode.

As shown in FIG. 8, as a result, the paste 41 is poured into the first through hole 13 and the second through hole 14. The paste 41 is arranged so as to be deflected to the positive Y side of the first through hole 13 and the second through hole 14. In each of the common terminal 11 and the drive terminal 12, the paste 41 is also arranged so as to be deflected to the positive Y direction side. The paste 41 arranged in the first through hole 13 and the second through hole 14 by the squeegee 42 moving in the first sliding direction 43 is defined as first paste 41a.

Figure 9:
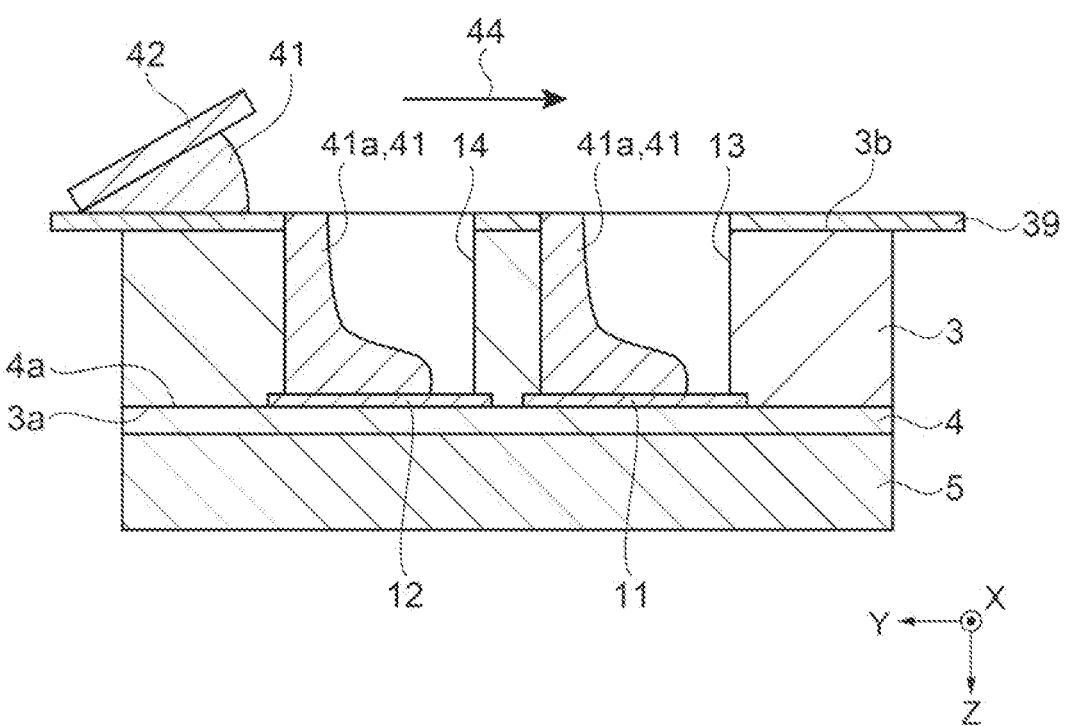
FIG. 9 is a schematic sectional side view for explaining the method of manufacturing the through electrode.

As shown in FIG. 9, the negative Y direction is defined as a second sliding direction 44. The second sliding direction 44 is a reverse direction to the first sliding direction 43. The squeegee 42 is slid in the second sliding direction 44 in the state in which the squeegee 42 at the positive Y direction side has contact with the stencil 39. The paste 41 is pushed by the squeegee 42 to move in the second sliding direction 44.

Figure 10:
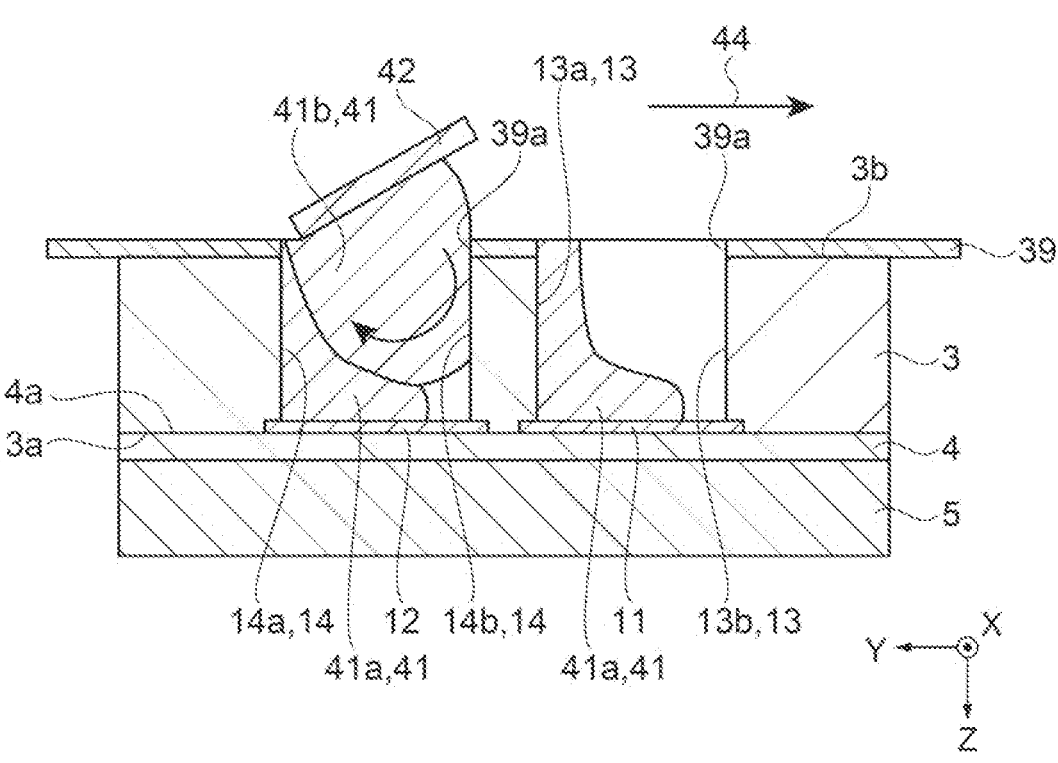
FIG. 10 is a schematic sectional side view for explaining the method of manufacturing the through electrode.

As shown in FIG. 10, when the squeegee 42 passes through the second through hole 14, a part of the paste 41 passes through the hole 39a to enter the second through hole 14. The paste 41 arranged in the second through hole 14 by the squeegee 42 moving in the second sliding direction 44 is defined as second paste 41b. A part of the second paste 41b moves toward the drive terminal 12 along the fourth wall 14b. Since the first paste 41a has already existed on the drive terminal 12, the second paste 41b having reached the first paste 41a moves in the positive Y direction along the first paste 41a. The second paste 41b moving toward the drive terminal 12 along the fourth wall 14b does not reach the drive terminal 12. By adjusting the viscosity of the paste 41, it is possible to prevent the second paste 41b from reaching the drive terminal 12.

When the squeegee 42 passes through the first through hole 13, a part of the paste 41 passes through the hole 39a to enter the first through hole 13. The part of the paste 41 moves toward the common terminal 11 along the second wall 13b. Since the first paste 41a has already existed on the common terminal 11, the paste 41 having reached the first paste 41a moves in the positive Y direction along the first paste 41a. The paste 41 moving toward the common terminal 11 along the second wall 13b does not reach the common terminal 11.

Figure 11:
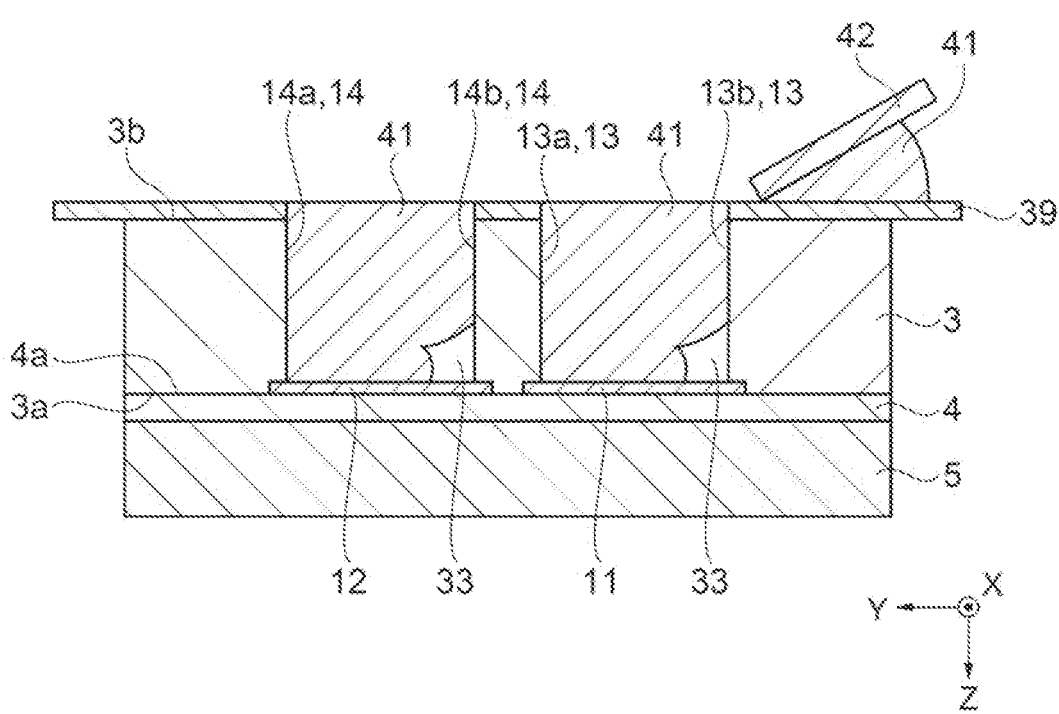
FIG. 11 is a schematic sectional side view for explaining the method of manufacturing the through electrode.

As shown in FIG. 11, the paste 41 is poured into the first through hole 13 and the second through hole 14. In the first through hole 13, the void 33 is formed at a place where the second wall 13b and the common terminal 11 cross each other. In the second through hole 14, the void 33 is formed at a place where the fourth wall 14b and the drive terminal 12 cross each other. The void 33 is provided to a part of the paste 41 to form each of the first through electrode 15 and the second through electrode 16. The voids 33 are each an enclosed space. The voids are filled with air. The air in the voids 33 is made unachievable to move outside the first through hole 13 and the second through hole 14.

It should be noted that in the present embodiment, the first sliding direction 43 is the positive Y direction, and the second sliding direction 44 is the negative Y direction. In this case, the void 33 is formed at the negative Y direction side of each of the first through hole 13 and the second through hole 14. The first sliding direction 43 can be the negative Y direction, and the second sliding direction 44 can be the positive Y direction. In this case, in the first through hole 13, the void 33 is formed at a place where the first wall 13a and the common terminal 11 cross each other. In the second through hole 14, the void 33 is formed at a place where the third wall 14a and the drive terminal 12 cross each other.

Figure 12:
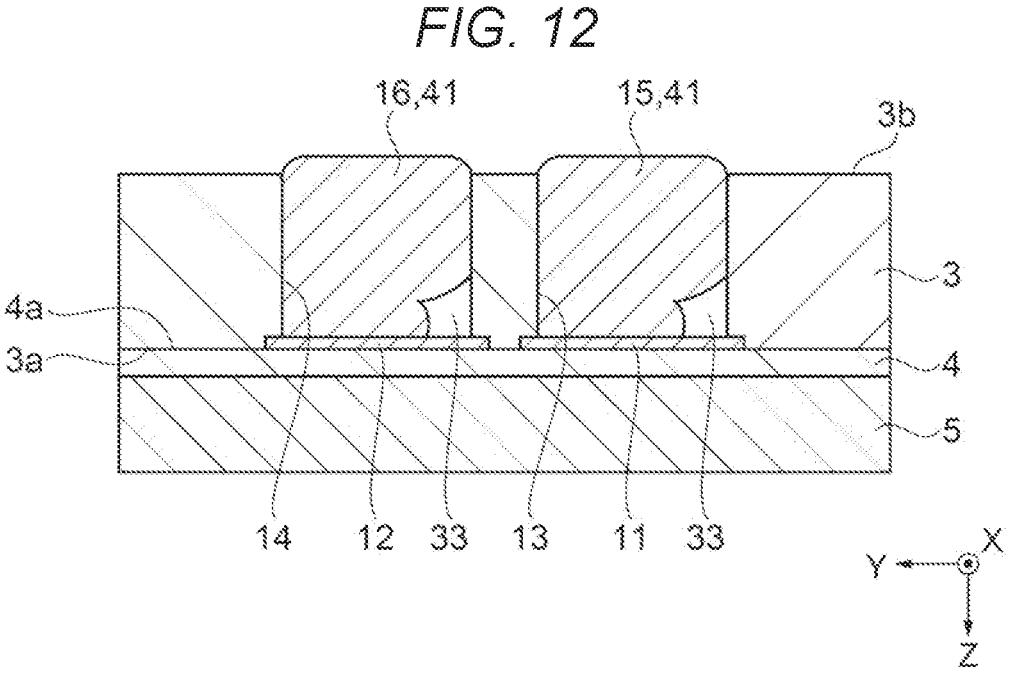
FIG. 12 is a schematic sectional side view for explaining the method of manufacturing the through electrode.

As shown in FIG. 12, the stencil 39 is removed from the second substrate 3. The paste 41 in the first through hole 13 and the second through hole 14 is dried by heating. As a result, in the first through hole 13, the paste 41 is solidified to form the first through electrode 15. In the second through hole 14, the paste 41 is solidified to form the second through electrode 16. The void 33 is provided to a part of each of the first through electrode 15 and the second through electrode 16. On this occasion, since the solvent included in the paste 41 evaporates, the paste 41 contracts. The volume of each of the first through electrode 15 and the second through electrode 16 becomes smaller than the volume of the paste 41.

Even when the paste 41 contracts when the first through electrode 15 and the second through electrode 16 are formed, the voids 33 expand. Therefore, since the stress of contracting the first through hole 13 and the second through hole 14 is reduced, the contraction of the first through hole 13 and the second through hole 14 is reduced.

According to this configuration, the paste 41 as the resin paste including the silver filler is poured into the first through hole 13 and the second through hole 14. By the solvent of the paste 41 evaporating, it is possible to provide the void 33 to a part of each of the first through electrode 15 and the second through electrode 16. In particular, by pouring the paste 41 into the first through hole 13 and the second through hole 14 in a plurality of times, it is possible to provide the void 33 to the part of each of the first through electrode 15 and the second through electrode 16.

Figure 13:
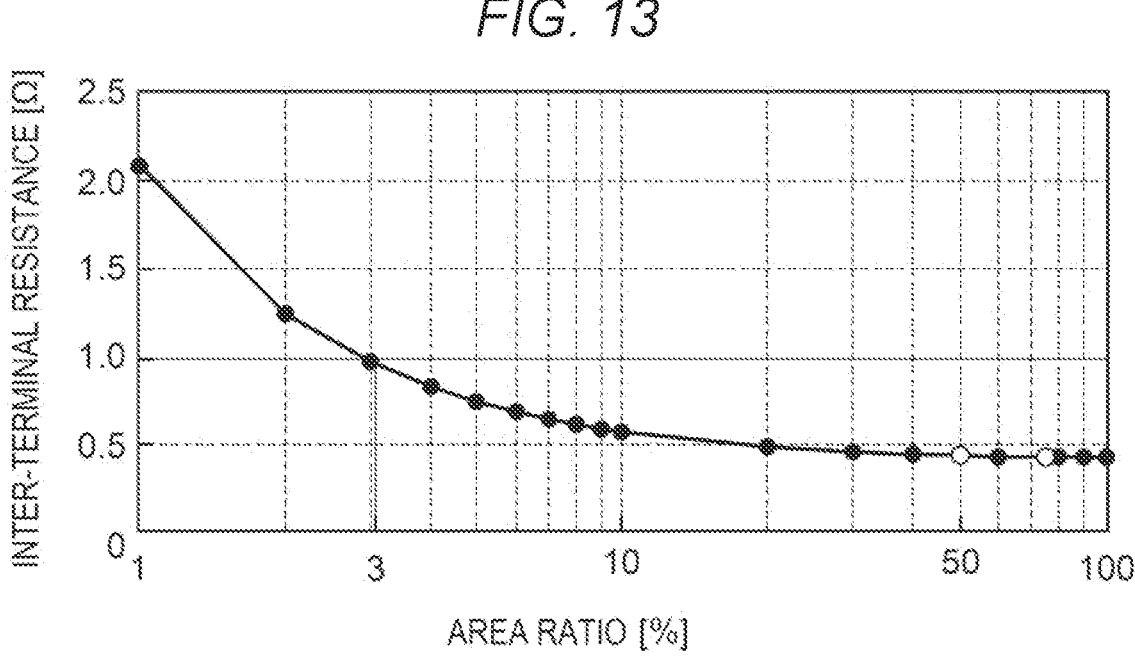
FIG. 13 is a diagram for explaining a relationship between an area ratio of the through electrode to a through hole and an inter-terminal resistance.

In FIG. 13, the area ratio in the horizontal axis represents a ratio of the area of the first through electrode 15 to the area of the first through hole 13 when viewed from the first direction 6. The inter-terminal resistance in the vertical axis represents the electrical resistance between the common terminal 11 and the common coupling terminal 21.

As long as the inter-terminal resistance is no higher than 1 ohm, the first through electrode 15 can properly be used. On this occasion, the ratio in area of the first through electrode 15 is equal to or higher than 3%.

When the proportion of the volume of the void 33 to the volume of the first through hole 13 is equal to or lower than 50%, since the ratio of the area of the first through electrode 15 to the area of the first through hole 13 is higher than 3%, the inter-terminal resistance between the common terminal 11 and the common coupling terminal 21 is no higher than 1 ohm. Therefore, the first through electrode 15 can properly be used.

When the ratio of the length in the second direction 36 of the void 33 to the length in the second direction 36 of the first through hole 13 is equal to or lower than 60%, since the ratio of the area of the first through electrode 15 to the area of the first through hole 13 is higher than 3%, the inter-terminal resistance between the common terminal 11 and the common coupling terminal 21 is no higher than 1 ohm. Therefore, the first through electrode 15 can properly be used.

Second Embodiment

In the first embodiment described above, the elements 7 are the piezoelectric elements. Besides the above, the elements 7 can be pressure detection elements or inertia detection elements. In this case, it is possible to adopt a structure in which the through electrode includes the void 33. It is possible to prevent the failure when the through electrode contracts.

What is claimed is:

1. An electronic device comprising:

a first substrate including a first face on which an element and a first electrode to be coupled to the element is disposed; and a second substrate which has a second face and a third face, and which is disposed so that the second face faces to the first face, wherein the second substrate has a through hole at a position corresponding to the first electrode, the through hole penetrating from the second face to the third face, a through electrode is provided in the through hole and electrically coupled to the first electrode, and a void is disposed in a part of the through electrode.

2. The electronic device according to claim 1, wherein a ratio of a volume of the void to a volume of the through hole is no lower than 1% and no higher than 50%.

3. The electronic device according to claim 1, wherein defining a stacking direction of the first substrate and the second substrate as a first direction, a ratio of a length in the first direction of the void to a length in the first direction of the through hole is no lower than 25% and no higher than 95%.

4. The electronic device according to claim 3, wherein defining a direction perpendicular to the first direction as a second direction, a ratio of a length in the second direction of the void to a length in the second direction of the through hole is no lower than 10% and no higher than 60%.

5. The electronic device according to claim 1, wherein the element is a piezoelectric element.

6. The electronic device according to claim 1, wherein the through electrode is resin including silver filler.

7. The electronic device according to claim 1, further comprising:

a third substrate which has a second electrode electrically coupling to the through electrode, and which is disposed so as to be opposed to the third face.

\* \* \* \* \*